(12) United States Patent
Chen et al.

(10) Patent No.: US 12,219,752 B2
(45) Date of Patent: Feb. 4, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Cheng Chen, Hefei (CN); Hai-Han Hung, Hefei (CN); Chun-Chieh Huang, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 368 days.

(21) Appl. No.: 17/648,725

(22) Filed: Jan. 24, 2022

(65) Prior Publication Data

US 2023/0056308 A1  Feb. 23, 2023

Related U.S. Application Data

(63) Continuation of application No. PCT/CN2021/121011, filed on Sep. 27, 2021.

(30) Foreign Application Priority Data

Aug. 20, 2021 (CN) .......................... 202110961599.5

(51) Int. Cl.
H10B 12/00 (2023.01)
(52) U.S. Cl.
CPC ......... H10B 12/485 (2023.02); H10B 12/053 (2023.02); H10B 12/34 (2023.02)

(58) Field of Classification Search
CPC ..... H10B 12/053; H10B 12/34; H10B 12/485
See application file for complete search history.

(56) References Cited

U.S. PATENT DOCUMENTS

| | | |
|---|---|---|
| 2003/0082875 A1 | 5/2003 | Lee |
| 2008/0217775 A1* | 9/2008 | Pai .................... H01L 21/76877 257/E23.141 |
| 2016/0118331 A1 | 4/2016 | Kim et al. |

FOREIGN PATENT DOCUMENTS

| | | |
|---|---|---|
| CN | 108520876 A | 9/2018 |
| CN | 109979940 A | 7/2019 |
| CN | 111430226 A | 7/2020 |
| CN | 113097145 A | 7/2021 |

\* cited by examiner

*Primary Examiner* — Meiya Li
(74) *Attorney, Agent, or Firm* — Syncoda LLC; Feng Ma

(57) ABSTRACT

The present disclosure provides a method of manufacturing a semiconductor structure and a semiconductor structure. The method includes: providing a base and forming, on the base, a bit line contact region provided with a first groove; forming a first bit line contact layer in the first groove, wherein the first bit line contact layer in the first groove defines a second groove; forming a diffusion layer in the second groove, wherein the diffusion layer in the second groove defines a third groove; forming, in the third groove, a second bit line contact layer provided with a gap; and processing the diffusion layer.

12 Claims, 10 Drawing Sheets

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/121011, filed on Sep. 27, 2021, which claims the priority to Chinese Patent Application No. 202110961599.5, titled "METHOD OF MANUFACTURING SEMICONDUCTOR STRUCTURE AND SEMICONDUCTOR STRUCTURE" and filed on Aug. 20, 2021. The entire contents of International Application No. PCT/CN2021/121011 and Chinese Patent Application No. 202110961599.5 are incorporated herein by reference.

TECHNICAL FIELD

The present disclosure relates to, but is not limited to, a method of manufacturing a semiconductor structure and a semiconductor structure.

BACKGROUND

The dynamic random access memory (DRAM) has advantages of a small size, a high degree of integration, and low power consumption, and is faster than the read-only memory (ROM). With the continuous development of the semiconductor industry, the requirements for semiconductor structures get increasingly high.

The bit line contact layer in the semiconductor structure is generally grown through a low-pressure chemical vapor deposition method by using a furnace tube, and there are film gaps in the bit line contact layer grown through this type of process. In the subsequent process, the film gaps are repaired by etching back the bit line contact layer by a predetermined depth, implanting germanium (Ge) ions, and performing rapid thermal annealing. In the process of implementing the present disclosure, there are at least the following problems found in the related art. The limited depth at which ions are implanted and changes in dose energy affect the electrical properties of the semiconductor structure. Only the surface layer of the film gap is repaired, and the entire film gap cannot be repaired, resulting in a decrease in the performance of the semiconductor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect of the embodiments of the present disclosure, a method of manufacturing a semiconductor structure is provided and includes:

providing a base, and forming a bit line contact region on the base, wherein a first groove is provided in the bit line contact region;

forming a first bit line contact layer in the first groove, wherein the first bit line contact layer extends to an outside of the first groove and covers the base, and the first bit line contact layer in the first groove defines a second groove;

forming a diffusion layer in the second groove, wherein the diffusion layer extends to an outside of the second groove and covers the first bit line contact layer, and the diffusion layer in the second groove defines a third groove;

forming a second bit line contact layer in the third groove, wherein the second bit line contact layer extends to an outside of third groove and covers the diffusion layer, and a gap is provided in the second bit line contact layer in the third groove; and processing the diffusion layer to enable ions in the diffusion layer to diffuse into the first bit line contact layer and the second bit line contact layer, and fill up the gap.

According to a second aspect of the embodiments of the present disclosure, a semiconductor structure is provided and includes:

a base, wherein a bit line contact region is formed on the base; and a bit line contact layer, wherein the bit line contact layer includes a first bit line contact layer, a transition layer, and a second bit line contact layer that are laminated sequentially in the bit line contact region.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

Figure 1:
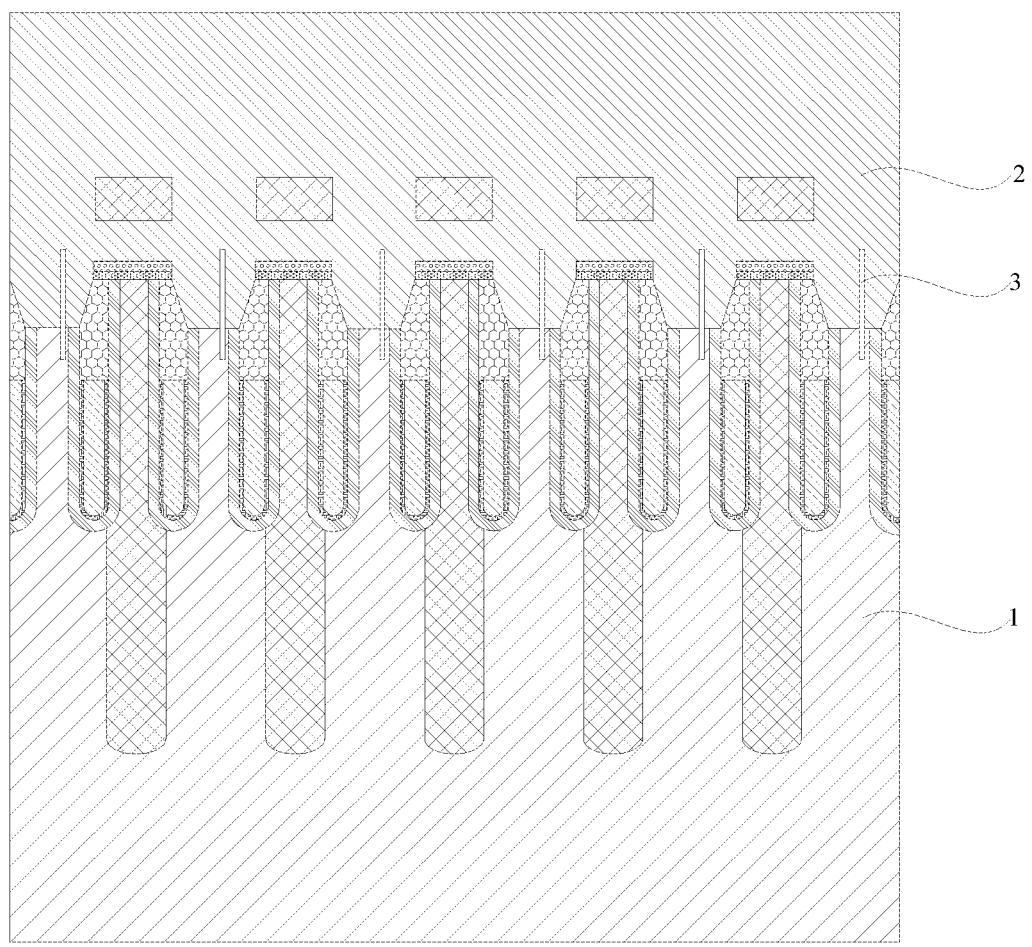
FIG. 1 to FIG. 4 are schematic diagrams of a repair process of film gaps in a semiconductor structure process.
Figure 2:
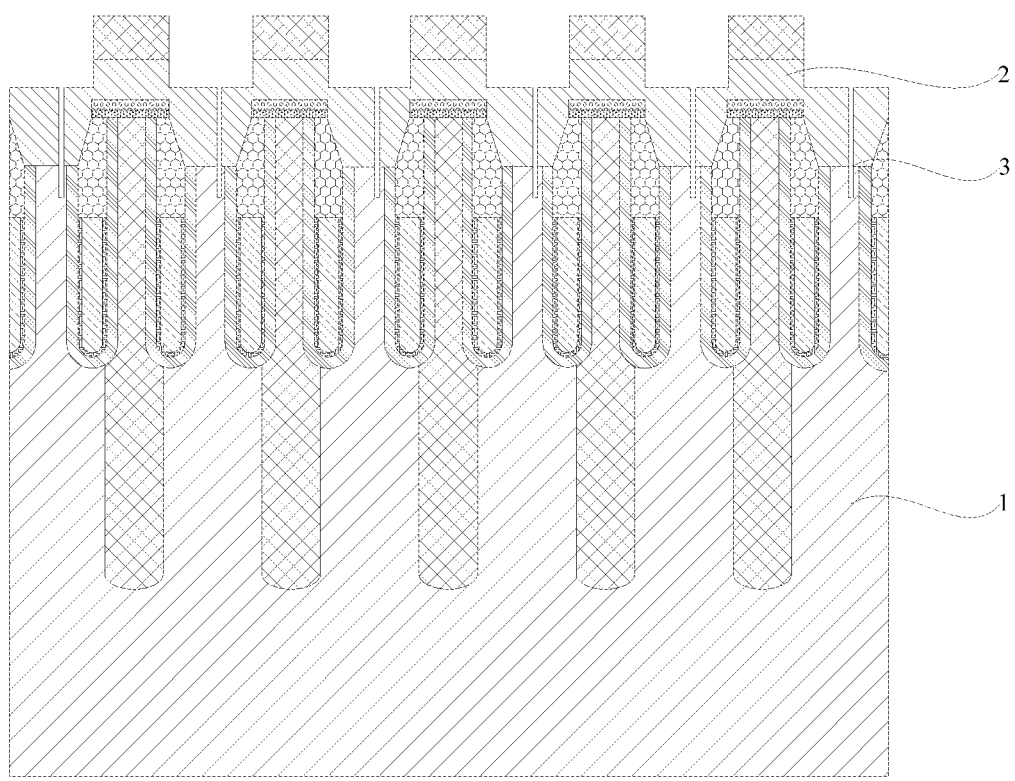
Figure 3:
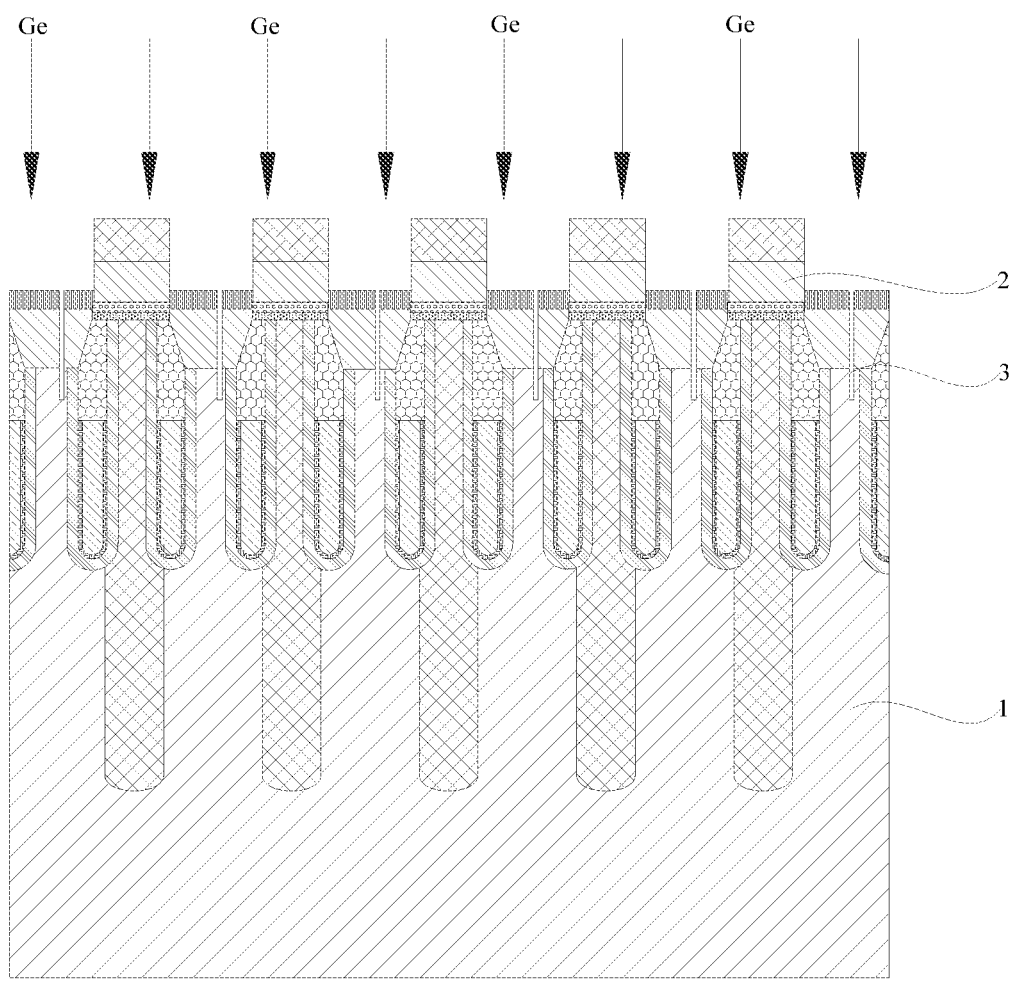
Figure 4:
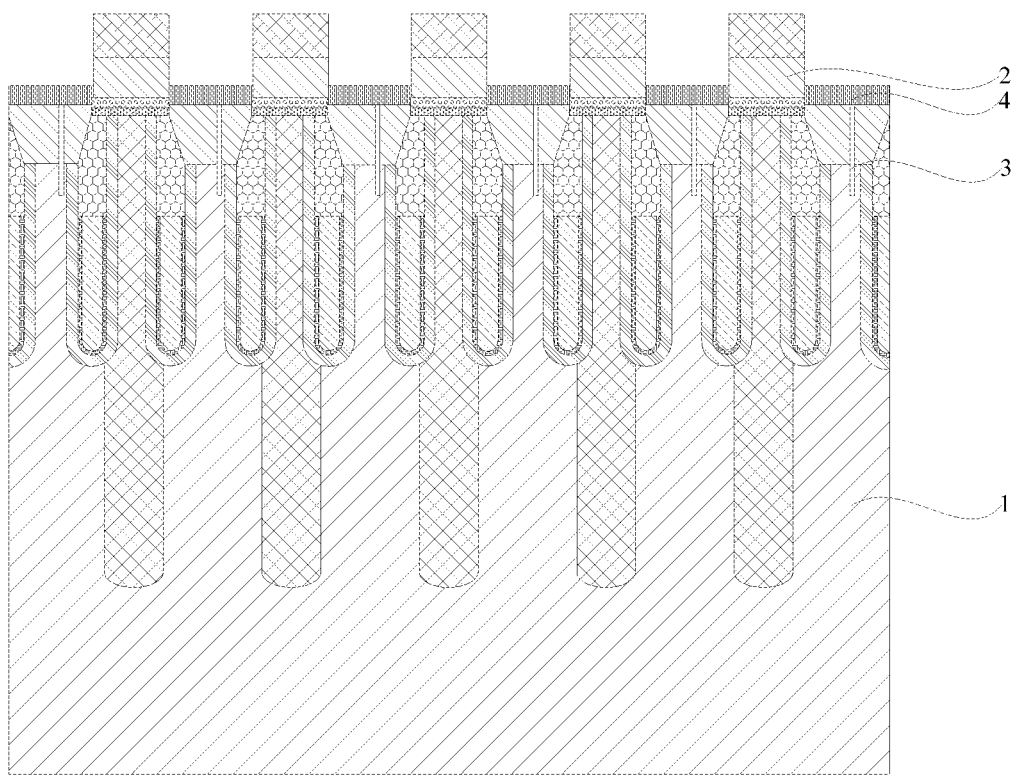

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As shown in FIG. 1 to FIG. 4, a bit line contact layer 2 in a semiconductor structure is generally grown through a low-pressure chemical vapor deposition method by using a furnace tube, and is disposed on a first base 1. There are film gaps 3 in the bit line contact layer 2 grown through this type of process. According to the current repair method, the film gaps 3 are repaired by engraving the bit line contact layer 2 to a predetermined depth, implanting Ge ions, and performing rapid thermal annealing. The limited depth at which ions are implanted and changes in dose energy affect the electrical properties of the semiconductor structure. Only a surface layer 4 of the film gap 3 is repaired, and the entire film gap cannot be repaired, resulting in a decrease in the performance of the semiconductor structure.

In a method of manufacturing a semiconductor structure and the semiconductor structure provided by the embodiments of the present disclosure, bit line contact layers in the bit line contact region are formed at two stages, and a diffusion layer is added in the process of forming the bit line contact layers. Then, the diffusion layer is processed to effectively repair the deep gaps in the semiconductor structure, thereby reducing the resistance of the semiconductor structure and improving the product yield and the performance of the semiconductor structure.

Figure 5:
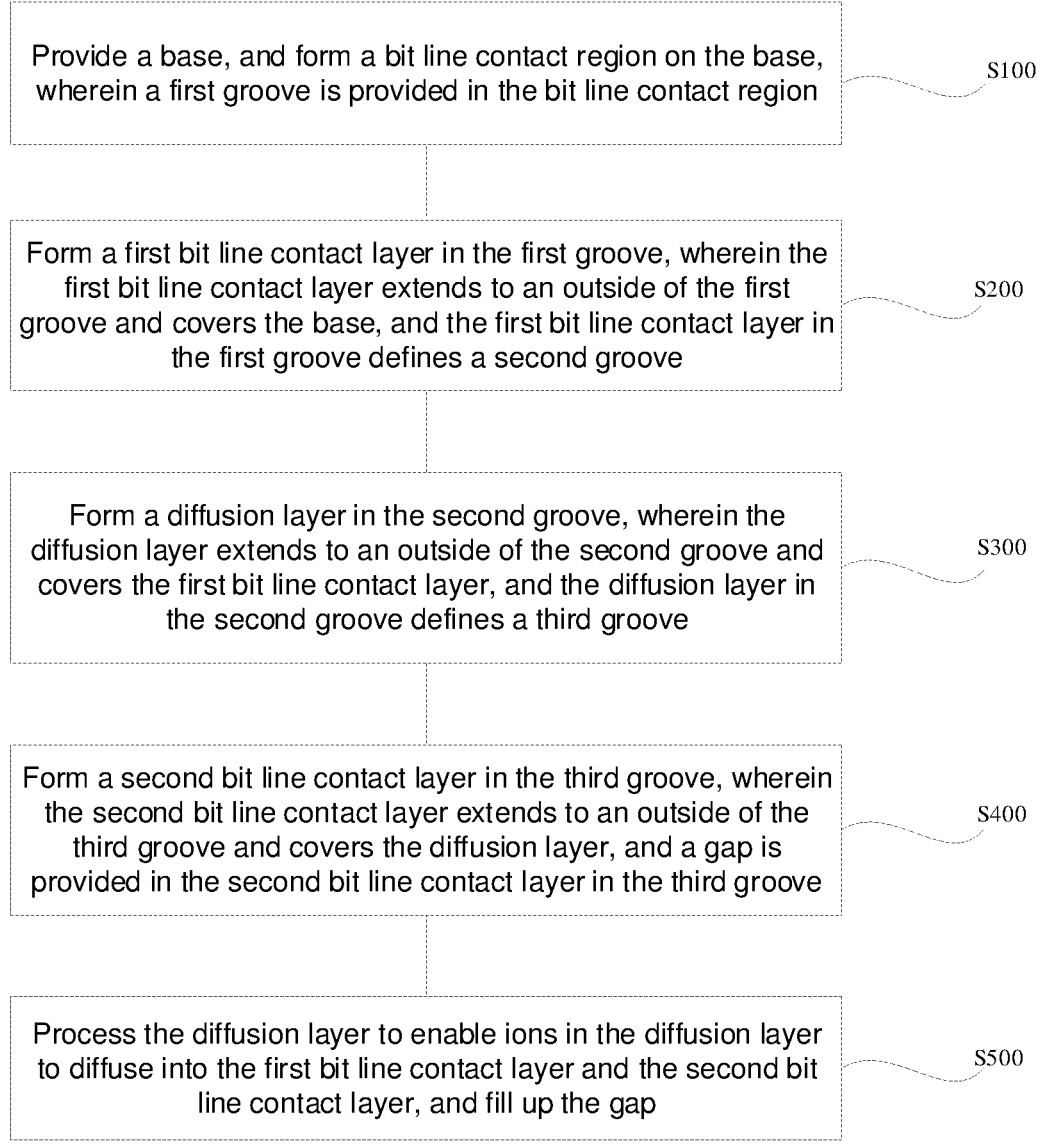
FIG. 5 is a flowchart of a method of manufacturing a semiconductor structure according to an exemplary embodiment.

An exemplary embodiment of the present disclosure provides a method of manufacturing a semiconductor structure. FIG. 5 is a flowchart of the method of manufacturing a semiconductor structure according to an exemplary embodiment of the present disclosure. FIG. 6 to FIG. 10 are schematic diagrams of various stages of the method of manufacturing a semiconductor structure. The method of manufacturing a semiconductor structure is described below with reference to FIG. 6 to FIG. 10.

The semiconductor structure is not limited in this embodiment. Description is made below by using an example in which the semiconductor structure is a DRAM, but this embodiment is not limited to this, and the semiconductor structure in this embodiment may also be other structures.

As shown in FIG. 5, an exemplary embodiment of the present disclosure provides the method of manufacturing a semiconductor structure, including the following steps:

step S100. Provide a base, and form a bit line contact region on the base, wherein a first groove is provided in the bit line contact region.

step S200. Form a first bit line contact layer in the first groove, wherein the first bit line contact layer extends to an outside of the first groove and covers the base, and the first bit line contact layer in the first groove defines a second groove.

step S300. Form a diffusion layer in the second groove, wherein the diffusion layer extends to an outside of the second groove and covers the first bit line contact layer, and the diffusion layer in the second groove defines a third groove.

step S400. Form a second bit line contact layer in the third groove, wherein the second bit line contact layer extends to an outside of third groove and covers the diffusion layer, and a gap is provided in the second bit line contact layer in the third groove.

step S500. Process the diffusion layer to enable ions in the diffusion layer to diffuse into the first bit line contact layer and the second bit line contact layer, and fill up the gap.

Figure 6:
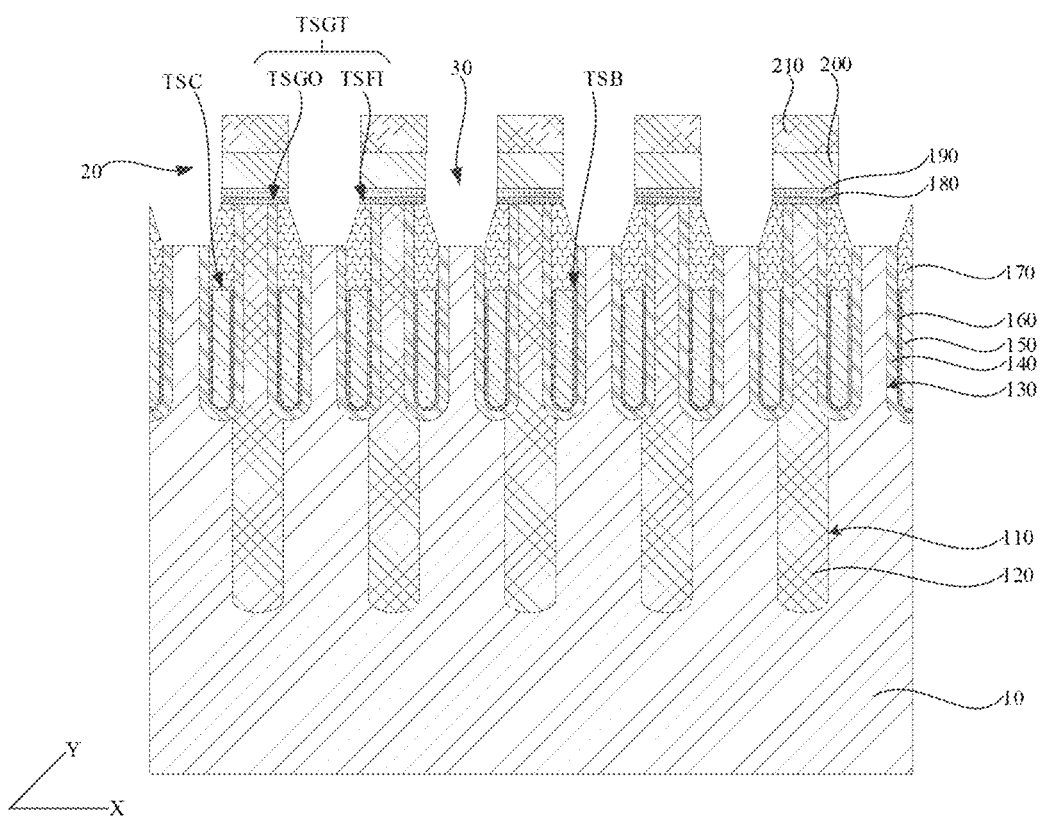
FIG. 6 is a schematic diagram of forming a bit line contact region in the method of manufacturing a semiconductor structure according to an exemplary embodiment.

For example, as shown in FIG. 6, in step S100, the base 10 serves as a support member of a memory and is used to support other components provided thereon. The base 10 may be made of a semiconductor material. The semiconductor material may be one or more of silicon, Ge, a SiGe compound, and a silicon-oxygen compound.

A bit line contact region 20 is formed on the base 10, and the bit line contact region 20 is provided with first grooves 30.

The bit line contact region 20 may be formed on the base 10 by using the following method:

A first mask layer and a first photoresist layer that are laminated sequentially are formed first on a top surface of the base 10. Then, a first mask pattern is formed on the first photoresist layer through exposure or development etching. The first mask pattern and the first grooves 30 formed subsequently are disposed on the base in the same manner. The first mask layer and the top surface of the base 10 are etched by using the first photoresist layer, with the first mask pattern, as a mask plate, to remove the first mask layer covered by the first mask pattern and the base 10 of a pre-determined depth, and form the plurality of first grooves 30 disposed at intervals. Finally, the retained first photoresist layer and first mask layer are removed, to form the bit line contact region 20 on the top surface of the base 10. In this case, the bit line contact region 20 is provided with the first grooves 30.

It should be note that the first mask layer may be of a single-layer structure or a laminated structure. When the first mask layer is of a laminated structure, the first mask pattern is transferred to the first mask layer, and the base is etched by using the first mask layer as a mask plate, to improve the accuracy of the pattern transfer and the performance of the semiconductor structure.

Figure 7:
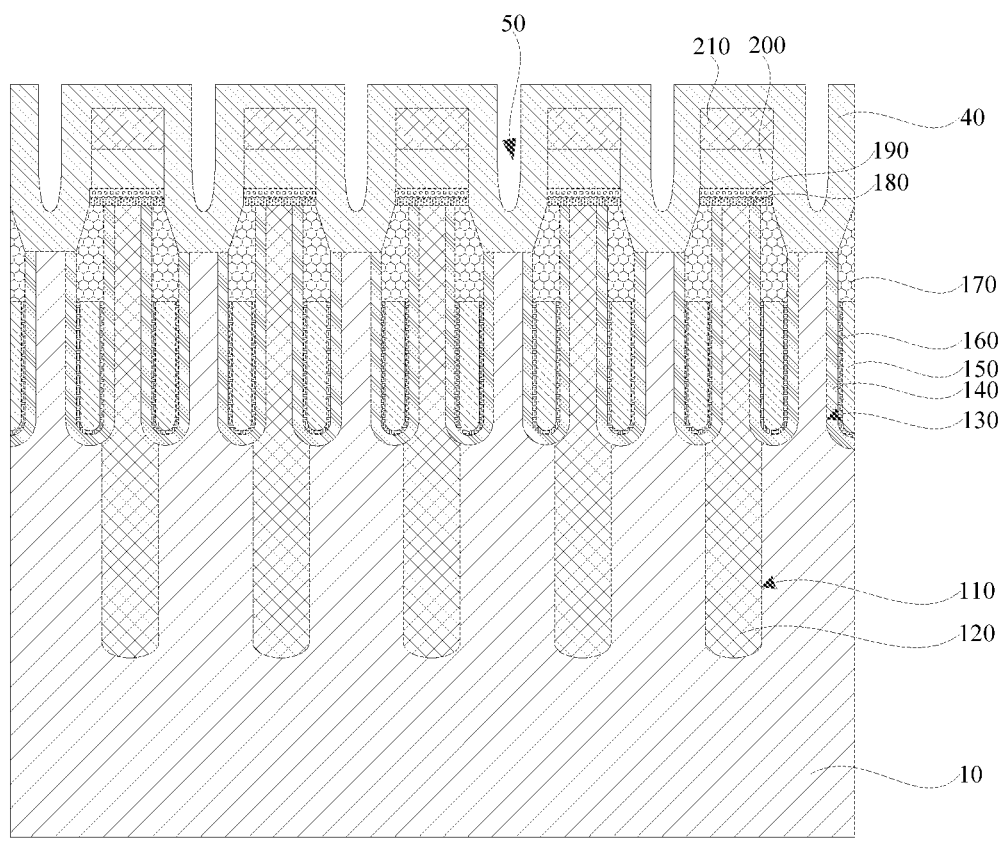
FIG. 7 is a schematic diagram of forming a first bit line contact layer in the method of manufacturing a semiconductor structure according to an exemplary embodiment.

In step S200, as shown in FIG. 7, a first bit line contact layer 40 is deposited in the first groove 30. The first bit line contact layer 40 includes a first polysilicon layer. The first polysilicon layer may be formed by using an atomic layer deposition process, a chemical vapor deposition process, or a physical vapor deposition process. In some embodiments, the first polysilicon layer may also be formed by introducing a deposition reaction gas such as one or more of silane ($SiH_4$), dichlorosilane ($SiH_2Cl_2$), disilane ($H_6Si_2$), and germanium alkane ($GeH_4$) that form a group.

In an exemplary embodiment, the first bit line contact layer 40 may be formed by using the fallowing method:

A first initial polysilicon layer is formed in the first groove 30 by using the atomic layer deposition process, the chemical vapor deposition process, or the physical vapor deposition process. Then, a second mask layer and a second photoresist layer that are laminated are formed on the first initial polysilicon layer. A second mask pattern is formed on the second photoresist layer through exposure or development etching. The second mask layer and the first initial polysilicon layer are etched by using the second polysilicon layer, with the second mask pattern, as a mask plate, to remove the second mask layer covered by the second mask pattern and the first initial polysilicon layer of a part of a depth, and form a plurality of second grooves 50 disposed at intervals. The retained first initial polysilicon layer forms the first polysilicon layer, that is, the first bit line contact layer 40. The retained second mask layer and second photoresist layer are finally removed. The first bit line contact layer 40 extends to the outside of the first groove 30 and covers the top surface of the base 10.

Figure 8:
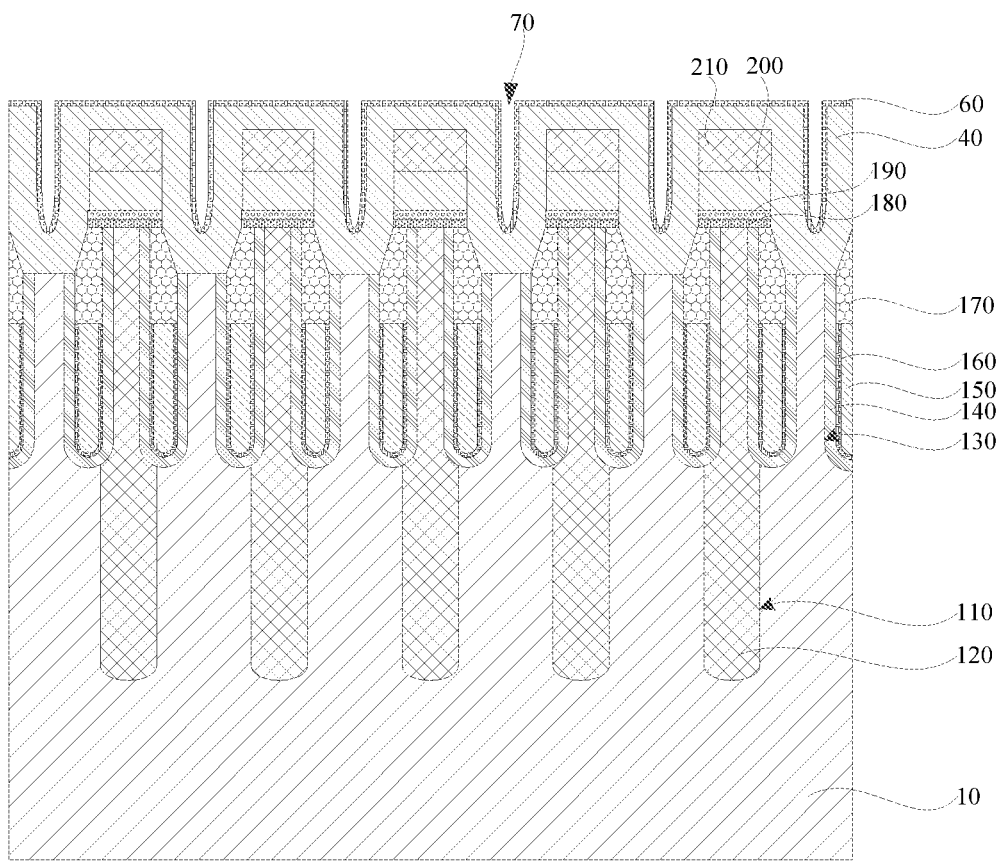
FIG. 8 is a schematic diagram of forming a diffusion layer in the method of manufacturing a semiconductor structure according to an exemplary embodiment.

In step S300, as shown in FIG. 8, a diffusion layer 60 is formed in the second groove 50.

The diffusion layer 60 may be formed by using the following method:

An initial diffusion layer is formed in the second groove 50. Then, a third mask layer and a third photoresist layer that are laminated are formed on the initial diffusion layer. A third mask pattern is formed on the third photoresist layer through exposure or development etching. The third mask layer and the initial diffusion layer are etched by using the third photoresist layer, with the third mask pattern, as a mask plate, to remove the third mask layer covered by the third mask pattern and parts of the initial diffusion layer, and form a plurality of third grooves 70 disposed at intervals. The retained initial diffusion layer forms the diffusion layer 60. The diffusion layer 60 extends to the outside of the second groove 50 and covers the first bit line contact layer 40. The diffusion layer 60 in the second grooves 50 defines a third groove 70. In some embodiments, a depth-to-width ratio of each of the third groove 70 is 2 to 10.

It may be noted that the diffusion layer 60 may include a third polysilicon layer. The diffusion layer 60 may be formed by using the atomic layer deposition process, the chemical vapor deposition process, or the physical vapor deposition process. When the diffusion layer 60 includes the third polysilicon layer, the third polysilicon layer needs to be doped with ions. The doped ions include one or more of Ge ions, boron ions, phosphorus ions, and nitrogen ions.

In some embodiments, the diffusion layer 60 may be a Ge layer or a SiGe layer by using the chemical vapor deposition process.

Figure 9:
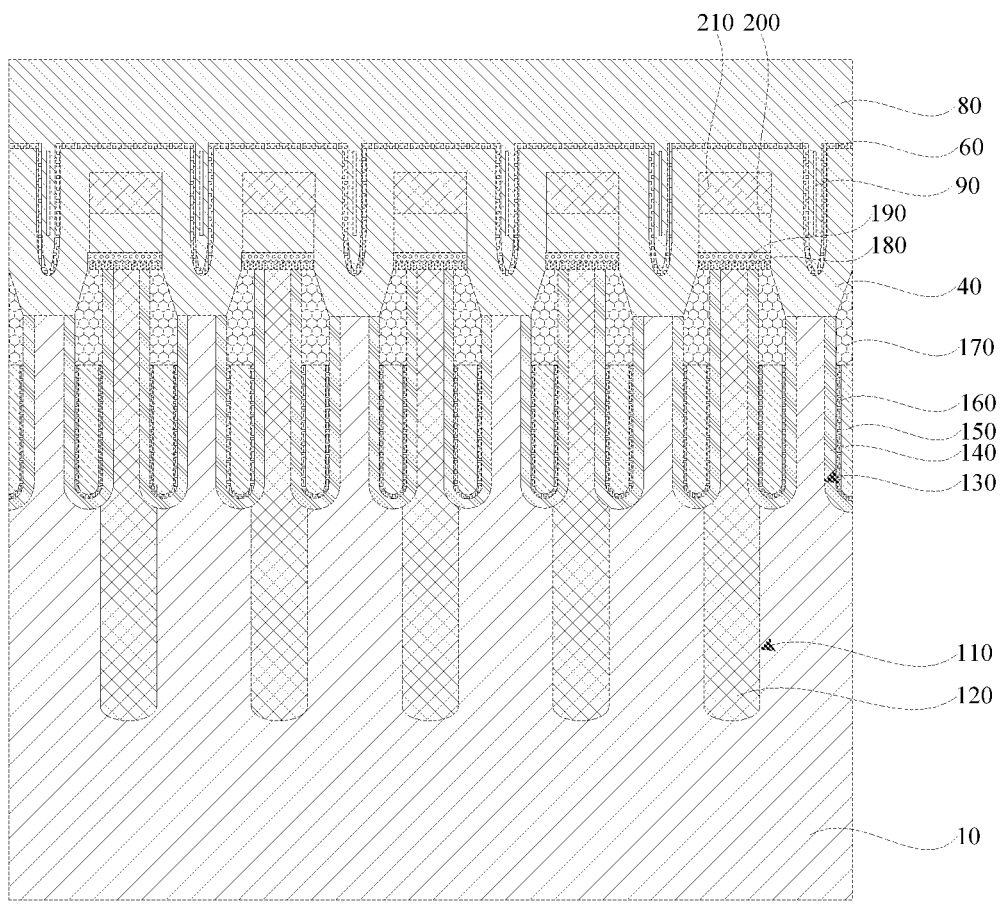
FIG. 9 is a schematic diagram of forming a second bit line contact layer in the method of manufacturing a semiconductor structure according to an exemplary embodiment.

In step S400, as shown in FIG. 9, a second bit line contact layer 80 is formed in the third groove 70, wherein the second bit line contact layer 80 extends to the outside of third groove 70 and covers the diffusion layer 60. In addition, a material of the second bit line contact layer 80 and a material of the first bit line contact layer 40 may be same or different. The second bit line contact layer 80 includes a second polysilicon layer. The second polysilicon layer may be formed by using the atomic layer deposition process, the chemical vapor deposition process, or the physical vapor deposition process. In some embodiments, the second polysilicon layer may also be formed by introducing a deposition reaction gas such as one or more of $SiH_4$, $SiH_2Cl_2$, $H_6Si_2$, and $GeH_4$ that form a group. For example, the second polysilicon layer may be formed by soaking $GeH_4$ or depositing $GeH_4$ and $SiH_4$ through the chemical vapor deposition process. The formed second bit line contact layer 80 extents to upper parts (in a direction shown in FIG. 9) of the third grooves 70 (with reference to FIG. 8) and covers the top surface of the diffusion layer 60.

It may be noted that the third groove 70 formed in step S120 has a high aspect ratio, so that gap 90 of a predetermined depth and a predetermined width are formed in the second bit line contact layer 80 formed in the third groove 70. In this case, the gap 90 need to be repaired, to avoid that the gap 90 reduces the performance of the semiconductor structure.

Figure 10:
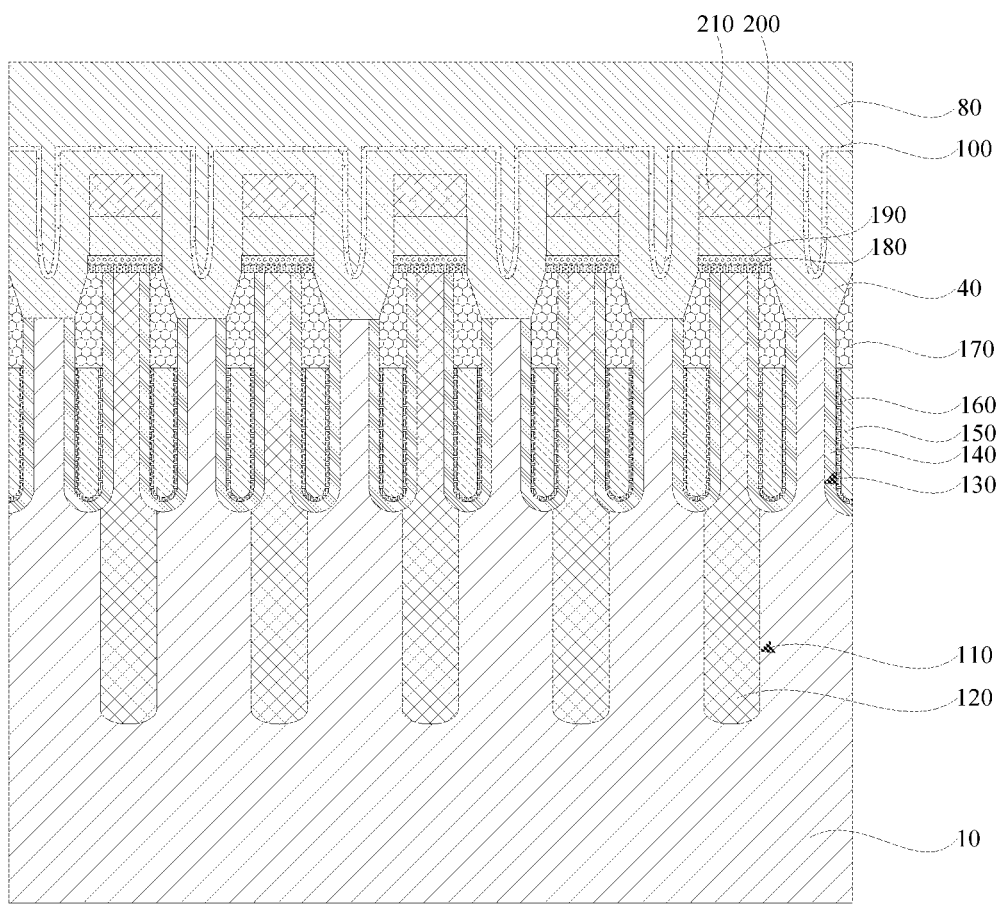
FIG. 10 is a schematic diagram of forming a transition layer in the method of manufacturing a semiconductor structure according to an exemplary embodiment.

In step S500, as shown in FIG. 10, when the gap 90 is formed in the second bit line contact layer 80, rapid thermal annealing is performed on the diffusion layer 60, to enable ions in the diffusion layer 60 to diffuse into the first bit line contact layer 40 and the second bit line contact layer 80, and fill up the gap 90, thereby repairing the gap 90.

In an example, the first bit line contact layer 40 is the first polysilicon layer formed by depositing $SiH_4$. The diffusion layer 60 is the third polysilicon layer doped with Ge ions. The second bit line contact layer 80 is the second polysilicon layer by depositing $GeH_4$ and $SiH_4$. In this example, the rapid thermal annealing is performed on the diffusion layer 60, to enable Ge ions in the third polysilicon layer to simultaneously diffuse into and be implanted into the first polysilicon layer and the second polysilicon layer, and finally a transition layer 100 is formed between the first bit line contact layer 40 and the second bit line contact layer 80.

In the forgoing embodiment, on the condition of ensuring the depth doping, the foregoing manner of implanting the Ge ions does not affect the electrical properties and structure of the semiconductor structure, and can effectively repair the deep gaps in the bit line contact layers, to reduce the resistance of the semiconductor structure device and increase the current of the semiconductor structure device.

According to an exemplary embodiment, as shown in FIG. 6 to FIG. 10, this embodiment describes an implementation of step S100 of proving the base 10 in the foregoing embodiment.

step S110. Form isolation structures on the base.

For example, a plurality of isolation trenches 110 that are disposed at intervals along a first direction are formed on a top surface of the base 10. A fourth mask layer and a fourth photoresist layer that are laminated may be deposited on the top surface of the base 10, and then be patterned to form the plurality of isolation trenches 110 disposed at intervals on the base 10. The first direction is shown with reference to the X direction in FIG. 6.

Then, an isolation material is deposited in the isolation trenches 110 to form isolation structures 120.

step S120. Form a plurality of word lines disposed at intervals along a second direction in the base, wherein the second direction and the first direction form an angle that is not zero.

In this step, a plurality of gate trenches 130 disposed at intervals along a second direction may be formed in the base 10. The second direction is shown with reference to the Y direction in FIG. 6. The gate trenches 130 may be formed in the base 10 by using the following manner. For example, a photoresist layer may be formed on the base 10 by using a coating-curing method, an inkjet printing method, or a deposition method and covers the upper surface of the base 10.

The photoresist layer is patterned through a patterning processing method such as masking, exposure, development and etching, to form a mask pattern. The mask pattern includes a plurality of shielding regions and a plurality of opening regions that are alternately arranged.

Then, the base 10 of a part of a depth in the opening regions is removed. A plurality of grooves that are disposed at intervals are formed on the base 10.

The to-be-removed photoresist layer may be removed by using a cleaning process such as ultrasonic cleaning or plasma cleaning, to form the plurality of gate trenches 130 disposed at intervals in the base 10.

Then, a gate oxide layer 140 is formed in each of the gate trenches 130 by using the atomic layer deposition process, the chemical vapor deposition process, or the physical vapor deposition process. A top surface of the gate oxide layer 140 is flush with a top surface (TSGT) of the gate trenches 130.

As shown in FIG. 6, before conductive layers 150 are formed in the gate trenches 130, a barrier layer 160 is formed first on an inner wall of each of the gate trenches 130 by using the atomic layer deposition process, the chemical vapor deposition process, or the physical vapor deposition process. A top surface of the barrier layers 160 is flush with the top surface of the conductive layer 150 formed subsequently. A material of the barrier layer 160 may include silicon nitride.

Next, each of the gate trenches 130 is filled with the conductive layer 150. The conductive layer 150 forms a word line. The top surface of the conductive layer 150 is lower than the top surface of the gate trench 130. In the implementation process, the conductive layer 150 of a certain thickness may be formed on a surface of the gate oxide layer 140 by using the chemical vapor deposition process or the physical vapor deposition process. A material of the conductive layer 150 may be metallic wolfram (W) or titanium nitride.

After the conductive layer 150 is formed, a first isolation layer 170 is deposited on the top surface of each of the conductive layer 150. Top surface of the first isolation layer 170 is flush with the top surface of the gate trench 130.

step S130. Form an isolation layer on the base.

For example, a second isolation layer 180 and a third isolation layer 190 that are laminated sequentially are formed on the base 10 by using the atomic layer deposition process, the chemical vapor deposition process, or the physical vapor deposition process. The second isolation layer 180 and the third isolation layer 190 form the isolation layers. The material of the second isolation layer 180 and the material of the third isolation layer 190 may be same or different.

step S140. Form a polysilicon layer and a mask layer sequentially on the isolation layer.

For example, a polysilicon layer 200 and a mask layer 210 that are laminated sequentially may be formed on the third isolation layer 190 by using the atomic layer deposition process or the chemical vapor deposition process. The material of the polysilicon layer 200 and the material of the first polysilicon layer or the material of the second polysilicon layer may be same.

step S150. Remove the polysilicon layer and each of the isolation layers partially according to a pattern defined by the mask layer, to form through hole, wherein the through hole exposes parts of the base to form the bit line contact region on the base.

In this step, there are a plurality of through holes formed at intervals. The process of forming through holes is the same as the process of forming the first grooves 30 in step S100 in the foregoing embodiment, that is, the through holes in this step are the first grooves 30. This is not repeated herein.

According to an exemplary embodiment of the present disclosure, as shown in FIG. 10, a semiconductor structure is further provided and includes the base 10 and bit line contact layers. The bit line contact region 20 is formed on the base 10. The bit line contact layers include the first bit line contact layer 40, the transition layer 100, and the second bit line contact layer 80 that are laminated sequentially in the bit line contact region 20. The transition layer 100 is formed after the diffusion layer 60 between the first bit line contact layer 40 and the second bit line contact layer 80 is processed.

After the second bit line contact layer 80 is formed, the gap 90 is formed therein. In this case, rapid thermal annealing is performed on the diffusion layer 60, so that ions in the diffusion layer 60 diffuse into and are implanted into the first bit line contact layer 40 and the second bit line contact layer 80, thereby filling up the gap 90.

On the condition of ensuring the depth doping, the foregoing manner of implanting the Ge ions does not affect the electrical properties and structure of the semiconductor structure, and can effectively repair the deep gaps in the bit line contact layers, to reduce the resistance of the semiconductor structure device, increase the current of the semiconductor structure device, and improve the performance of the semiconductor structure.

In some embodiments, the semiconductor structure further includes the plurality of isolation structures 120 disposed at intervals along the first direction in the base 10.

In some embodiments, the semiconductor structure further includes a plurality of word lines disposed at intervals along the second direction in the base 10. Each of the word lines is the conductive layer 150 formed by depositing metallic W or titanium nitride. Each of the conductive layer 150 is further wrapped with the barrier layer 160 and the gate oxide layer 140 sequentially. The top surface (TSB) of the barrier layer 160 is flush with the top surface (TSC) of the conductive layer 150. Each of the conductive layers 150 is provided with the first isolation layer 170. The top surface (TSFI) of the first isolation layer 170 is flush with the top surface (TSGO) of the gate oxide layer 140 and the top surface of the base 10. The first direction and the second direction form an angle that is not zero.

In some embodiments, each of the barrier layers 160 may include a silicon oxide layer; and each of the first isolation layers 170 may include a silicon nitride layer.

In the semiconductor structure of this embodiment, the diffusion layer is formed between the first bit line contact layer and the second bit line contact layer, and then is processed through rapid thermal annealing to effectively repair the deep gaps in the semiconductor structure, thereby reducing the resistance of the semiconductor structure and improving the product yield and the performance of the semiconductor structure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In a method of manufacturing a semiconductor structure and a semiconductor structure provided by the embodiments of the present disclosure, a diffusion layer is formed in a bit line contact region, and then is processed to effectively repair the deep gaps in the semiconductor structure, thereby reducing the resistance of the semiconductor structure and improving the product yield and the performance of the semiconductor structure.

The invention claimed is:

1. A method of manufacturing a semiconductor structure, comprising:
   providing a base, and forming a bit line contact region on the base, wherein a first groove is provided in the bit line contact region;
   forming a first bit line contact layer in the first groove, wherein the first bit line contact layer extends to an outside of the first groove and covers the base, and the first bit line contact layer in the first groove defines a second groove;
   forming a diffusion layer in the second groove, wherein the diffusion layer extends to an outside of the second groove and covers the first bit line contact layer, and the diffusion layer in the second groove defines a third groove;
   forming a second bit line contact layer in the third groove, wherein the second bit line contact layer extends to an outside of third groove and covers the diffusion layer, and a gap is provided in the second bit line contact layer in the third groove; and
   processing the diffusion layer to enable ions in the diffusion layer to diffuse into the first bit line contact layer and the second bit line contact layer, and fill up the gap.

2. The method of manufacturing the semiconductor structure according to claim 1, wherein
   the forming the diffusion layer in the second groove comprises:
   forming a germanium layer or a silicon germanium layer by using a chemical vapor deposition process to form the diffusion layer.

3. The method of manufacturing the semiconductor structure according to claim 1, further comprising:
   doping the diffusion layer with the ions, wherein the ions comprise one or more of Ge ions, boron ions, phosphorus ions, and nitrogen ions.

4. The method of manufacturing the semiconductor structure according to claim 1, wherein
   the processing the diffusion layer comprises:
   performing rapid thermal annealing on the diffusion layer.

5. The method of manufacturing the semiconductor structure according to claim 1, further comprising:
   forming an isolation structure on the base.

6. The method of manufacturing the semiconductor structure according to claim 5, wherein
   the forming the isolation structure on the base comprises:
   forming a plurality of isolation trenches disposed at intervals along a first direction on the base; and
   forming the isolation structure in each of the plurality of isolation trenches.

7. The method of manufacturing the semiconductor structure according to claim 6, further comprising:
   forming a plurality of word lines disposed at intervals along a second direction in the base, wherein the second direction and the first direction form an angle that is not zero.

8. The method of manufacturing the semiconductor structure according to claim 7, wherein
   the forming the plurality of word lines disposed at the intervals along the second direction in the base comprises:
   forming a plurality of gate trenches disposed at the intervals along the second direction on the base;
   forming a gate oxide layer in the plurality of gate trenches, wherein a top surface of the gate oxide layer is flush with top surfaces of the plurality of gate trenches; and
   filling the plurality of gate trenches with a conductive layer, wherein a top surface of the conductive layer is lower than the top surfaces of the plurality of gate trenches, to form the plurality of word lines.

9. The method of manufacturing the semiconductor structure according to claim 8, further comprising:
   forming a barrier layer on inner walls of the plurality of gate trenches, wherein a top surface of the barrier layer is lower than the top surfaces of the plurality of gate trenches and flush with the top surface of the conductive layer.

10. The method of manufacturing the semiconductor structure according to claim 9, further comprising:
    forming a first isolation layer on the conductive layer, wherein a top surface of the first isolation layer is flush with the top surfaces of the plurality of gate trenches.

11. The method of manufacturing the semiconductor structure according to claim 10, further comprising:
    forming an isolation layer on the base;
    forming a polysilicon layer and a mask layer sequentially on the isolation layer; and
    removing the polysilicon layer and the isolation layer partially according to a pattern defined by the mask layer, and forming the first groove, wherein the first groove exposes parts of the base to form the bit line contact region on the base.

12. The method of manufacturing the semiconductor structure according to claim 11, wherein the forming the isolation layer on the base comprises:
forming a second isolation layer on the base; and
forming a third isolation layer on the second isolation layer.

\* \* \* \* \*